(12) United States Patent
Lamorey et al.

(10) Patent No.: US 7,260,004 B2
(45) Date of Patent: Aug. 21, 2007

(54) METHOD AND APPARATUS FOR INCREASING YIELD IN A MEMORY CIRCUIT

(75) Inventors: Mark Curtis Hayes Lamorey, South Burlington, VT (US); Yu Lu, Hopewell Junction, NY (US); Janusz Jozef Nowak, Highland Mills, NY (US)

(73) Assignee: International Busniess Machines Corporation, Armonk, NY (US)

( * ) Notice: Subject to any disclaimer, the term of this patent is extended or adjusted under 35 U.S.C. 154(b) by 16 days.

(21) Appl. No.: 11/330,492

(22) Filed: Jan. 12, 2006

(65) Prior Publication Data
US 2007/0159898 A1    Jul. 12, 2007

(51) Int. Cl.
*G11C 29/00* (2006.01)
(52) U.S. Cl. ..................... 365/201; 365/200
(58) Field of Classification Search ............ 365/185.02
See application file for complete search history.

(56) References Cited

U.S. PATENT DOCUMENTS

| | | | |
|---|---|---|---|
| 6,219,280 B1* | 4/2001 | Naganawa | 365/185.22 |
| 6,452,836 B1* | 9/2002 | Roohparvar | 365/185.22 |
| 6,477,081 B2* | 11/2002 | Poechmueller | 365/158 |
| 6,584,589 B1* | 6/2003 | Perner et al. | 714/721 |
| 6,839,275 B2* | 1/2005 | Van Brocklin et al. | 365/173 |
| 2002/0003727 A1* | 1/2002 | Hartmann | 365/200 |
| 2002/0048191 A1* | 4/2002 | Ikehashi et al. | 365/185.22 |
| 2005/0169095 A1* | 8/2005 | Bedeschi et al. | 365/232 |

* cited by examiner

*Primary Examiner*—Tan T. Nguyen
(74) *Attorney, Agent, or Firm*—Ryan, Mason & Lewis, LLP

(57) ABSTRACT

Apparatus for repairing one or more shorted memory cells in a memory circuit includes control circuitry. The control circuitry is operative in one of at least a first mode and a second mode. In the first mode, the control circuitry is operative to apply a first signal to a selected memory cell in the memory circuit for reading a logic state of the selected memory cell and to determine whether or not the selected memory cell is shorted. In the second mode, the control circuitry is operative to apply a second signal to a selected memory cell which has been determined to be shorted for initiating a repair of the selected memory cell, the second signal being greater in magnitude than the first signal.

19 Claims, 5 Drawing Sheets

METHOD AND APPARATUS FOR INCREASING YIELD IN A MEMORY CIRCUIT

FIELD OF THE INVENTION

The present invention relates generally to memory devices, and more particularly relates to techniques for increasing yield in a memory device.

BACKGROUND OF THE INVENTION

Magnetic random access memory (MRAM), particularly MRAM using an array of magnetic tunnel junction (MTJ) devices as storage elements, is employed in a wide variety of circuits and applications. As storage density requirements continue to increase, the design of MRAM circuit architectures to meet such requirements becomes significantly more challenging. Furthermore, with greater storage density comes a higher likelihood that one or more memory cells (i.e., bits) in the MRAM will be defective (e.g., shorted). Thus, although it would be desirable to achieve one hundred percent yield of working devices, such a yield is generally not attainable in a high-density memory device within a reasonable cost.

Conventionally, MRAM is often designed with a certain amount of built-in redundancy, so that defective memory cells, at final test, can be identified, readdressed and essentially replaced by memory cells residing in a redundancy area of the device. While this approach has had some success at increasing yield, the additional chip area required in order to incorporate such redundancy in the MRAM device comes at the price of significantly lower storage density in the device and is therefore undesirable. Moreover, due to the ever-increasing storage capacity of MRAM, the number of defects is becoming so large that the redundancy methodology is no longer a viable solution.

Accordingly, there exists a need for techniques capable of providing enhanced yield in a memory circuit that do not suffer from one or more of the problems exhibited by conventional memory architectures and methodologies.

SUMMARY OF THE INVENTION

The present invention meets the above-noted need by providing improved techniques for increasing yield in a memory device utilizing tunneling-based storage cells (e.g., MTJ devices, spin valves, etc.). This can be accomplished, in an illustrative embodiment of the invention, by applying a stressing voltage, which is substantially greater than a read voltage of the memory circuit, only to memory cells determined to be shorted in order to initiate a repair of the shorted memory cell, while protecting non-shorted cells or previously repaired cells in the memory circuit from receiving the stressing voltage. In this manner, the present invention can beneficially increase a yield of working memory devices without significantly increasing the required chip area of the device.

In accordance with one aspect of the invention, apparatus for repairing one or more shorted memory cells in a memory circuit includes control circuitry. The control circuitry is operative in one of at least a first mode and a second mode. In the first mode, the control circuitry is operative to apply a first signal to a selected memory cell in the memory circuit for reading a logic state of the selected memory cell and to determine whether or not the selected memory cell is shorted. In the second mode, the control circuitry is operative to apply a second signal to a selected memory cell which has been determined to be shorted for initiating a repair of the selected memory cell, the second signal being greater in magnitude than the first signal. At least one apparatus for repairing one or more shorted memory cells in a memory circuit may be implemented in one or more integrated circuit devices.

In accordance with another aspect of the invention, a method for repairing one or more shorted memory cells in a memory circuit includes the steps of: setting a signal to be applied to a selected memory cell in the memory circuit to a first value; setting a current address to a value corresponding to a current selected memory cell in the memory circuit; reading a logic state of the current selected memory cell with the signal at the first value and determining whether or not the current selected memory cell is shorted; when the current selected memory cell is determined to be shorted, initiating a repair of the shorted memory cell, and repeating the steps of reading the logic state of the current selected memory cell and determining whether or not the selected memory cell is shorted; and when the current selected memory cell is determined to be not shorted, setting the current address to a value corresponding to a new current selected memory cell which has not been previously read, and repeating the steps of reading the logic state of the current selected memory cell and determining whether or not the selected memory cell is shorted.

In accordance with a third aspect of the invention, a method for repairing one or more shorted memory cells in a memory circuit includes the steps of: setting a signal to be applied to a selected memory cell in the memory circuit to a first value; setting a current address to a value corresponding to a current selected memory cell in the memory circuit; reading a logic state of the current selected memory cell with the signal at the first value and determining whether or not the current selected memory cell is shorted; when the current selected memory cell is determined to be shorted, storing the current address corresponding to the shorted memory cell; setting the current address to a value corresponding to a new current selected memory cell which has not been previously read, and repeating the steps of reading the logic state of the current selected memory cell and determining whether or not the selected memory cell is shorted; and when at least one address corresponding to a shorted memory cell has been stored, initiating a repair of the shorted memory cell.

These and other features and advantages of the present invention will become apparent from the following detailed description of illustrative embodiments thereof, which is to be read in connection with the accompanying drawings.

DETAILED DESCRIPTION OF THE INVENTION

Figure 1:
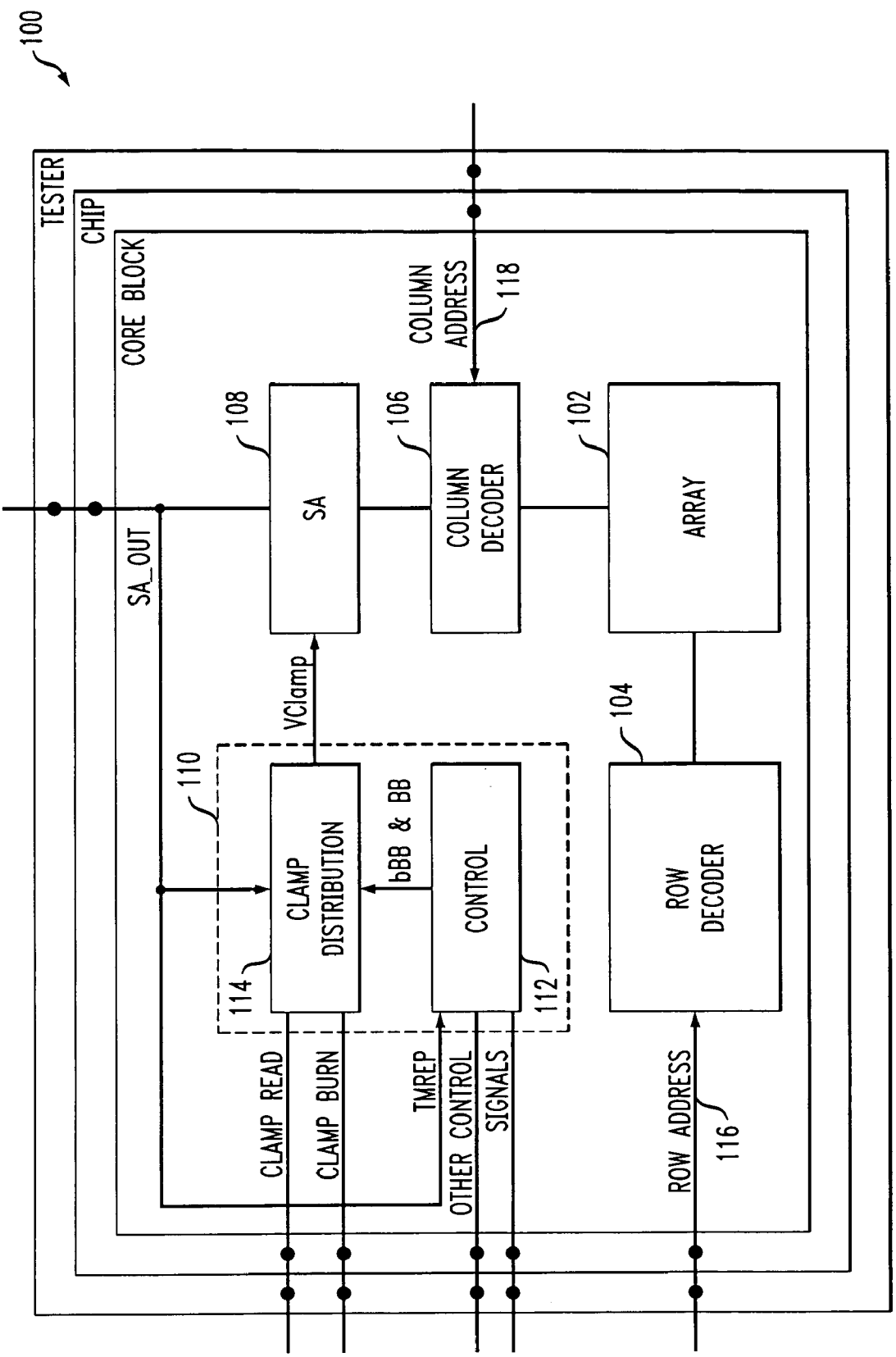
FIG. 1 is a block diagram illustrating at least a portion of a memory circuit, formed in accordance with one embodiment of the invention.

The present invention will be described herein in the context of an illustrative MRAM architecture and related circuitry (e.g., sense amplifier) which may be employed therewith. It should be understood, however, that the present invention is not limited to the particular circuit arrangements shown. Rather, the invention is more generally applicable to techniques for advantageously improving the yield of memory circuits employing tunneling-based storage cells (e.g., MTJ devices, spin valves, etc.), without significantly increasing a chip area required by the memory circuits. Although the present invention may be described herein with specific reference to MRAM, the techniques of the invention may be similarly applied to alternative memory architectures including, but not limited to, phase change memory (PCM) or other memory architectures utilizing storage cells having programmable resistances associated therewith (e.g., giant-magnetoresistive (GMR) cells). Moreover, while the methodologies of the invention are intended to eliminate the need for a redundancy area in a memory device, or at least substantially reduce the amount of redundancy area required, the techniques of the invention may be similarly employed in a memory device comprising a redundancy area, particularly in devices wherein the redundancy area is too small for the number of defective bits.

While implementations of the present invention are described herein with specific reference to n-channel metal-oxide-semiconductor (NMOS) field-effect transistor (FET) devices and p-channel metal-oxide-semiconductor (PMOS) FET devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will become apparent to those skilled in the art.

In the accompanying figures, like reference numerals designate identical or corresponding elements (e.g., functional blocks, process steps, etc.) throughout the several views.

A large number of failures detected in a memory circuit result from shorted bits. In the case of a memory circuit employing tunneling-based storage cells (e.g., MTJ devices), each memory cell is typically composed of two magnetic layers separated by a very thin (e.g., about a few atoms thick) nonmagnetic spacer or tunneling barrier. In such tunneling-based memory cells, a short between the two magnetic layers often occurs during fabrication of the memory device. In accordance with one aspect of the invention, a stressing voltage is preferably applied to a shorted memory cell, also referred to synonymously as a bit, in order to repair the cell. However, the stressing voltage can damage non-shorted cells or cells that have been previously repaired. Therefore, the invention, in an illustrative embodiment thereof, provides a methodology for repairing only shorted memory cells while protecting non-shorted cells or previously repaired cells in the memory circuit from receiving the stressing voltage. In this manner, a yield of functioning memory circuits is substantially improved.

FIG. 1 is a block diagram illustrating at least a portion of an exemplary memory circuit 100 in which the techniques of the present invention are implemented. The memory circuit 100 preferably comprises a memory array 102, a row decoder 104, a column decoder 106, sense amplifier (SA) circuitry 108, and interface circuitry 110. The interface circuitry 110, which can be used to interface with an external circuit and/or system (e.g., a tester), may comprise control circuitry 112 and clamp voltage distribution circuitry 114, which will be described in further detail below.

Memory array 102 preferably comprises a plurality of memory cells (not directly shown), each memory cell storing a voltage which is indicative of a logic state of the cell (e.g., "0" or "1"). The memory cells may be arranged in a plurality of rows and columns, with each memory cell being accessed, such as during a read or a write operation, according to its unique row and column, as is conventionally done in a random access memory. Alternative memory array configurations are similarly contemplated by the invention. The row decoder 104 is preferably operative to receive a row address 116 and to generate a row select signal in response thereto corresponding to a selected row of memory cells in the memory array 102. Likewise, the column decoder 106 is preferably operative to receive a column address 118 and to generate a column select signal in response thereto corresponding to a selected column of memory cells in the memory array 102. A selected memory cell will reside at an intersection of a selected row and a selected column in the memory array 102.

The sense amplifier circuitry 108 preferably comprises a plurality of sense amplifiers (not directly shown), each sense amplifier being connected to a corresponding column in the memory array 102 via the column decoder 106. Alternatively, the sense amplifier circuitry 108 may comprise a single sense amplifier and related switching circuitry (e.g., multiplexer) for electrically connecting an input of the sense amplifier to a selected one of the columns in the memory array 102 (e.g., in accordance with the column address). A sense amplifier is operative to read the logic states of memory cells residing in the column corresponding thereto. Generally, a single memory cell is selected in a given column during a read cycle. Illustrative sense amplifiers suitable for use in the memory circuit 100 are described in further detail below in conjunction with FIG. 2.

Figure 2:
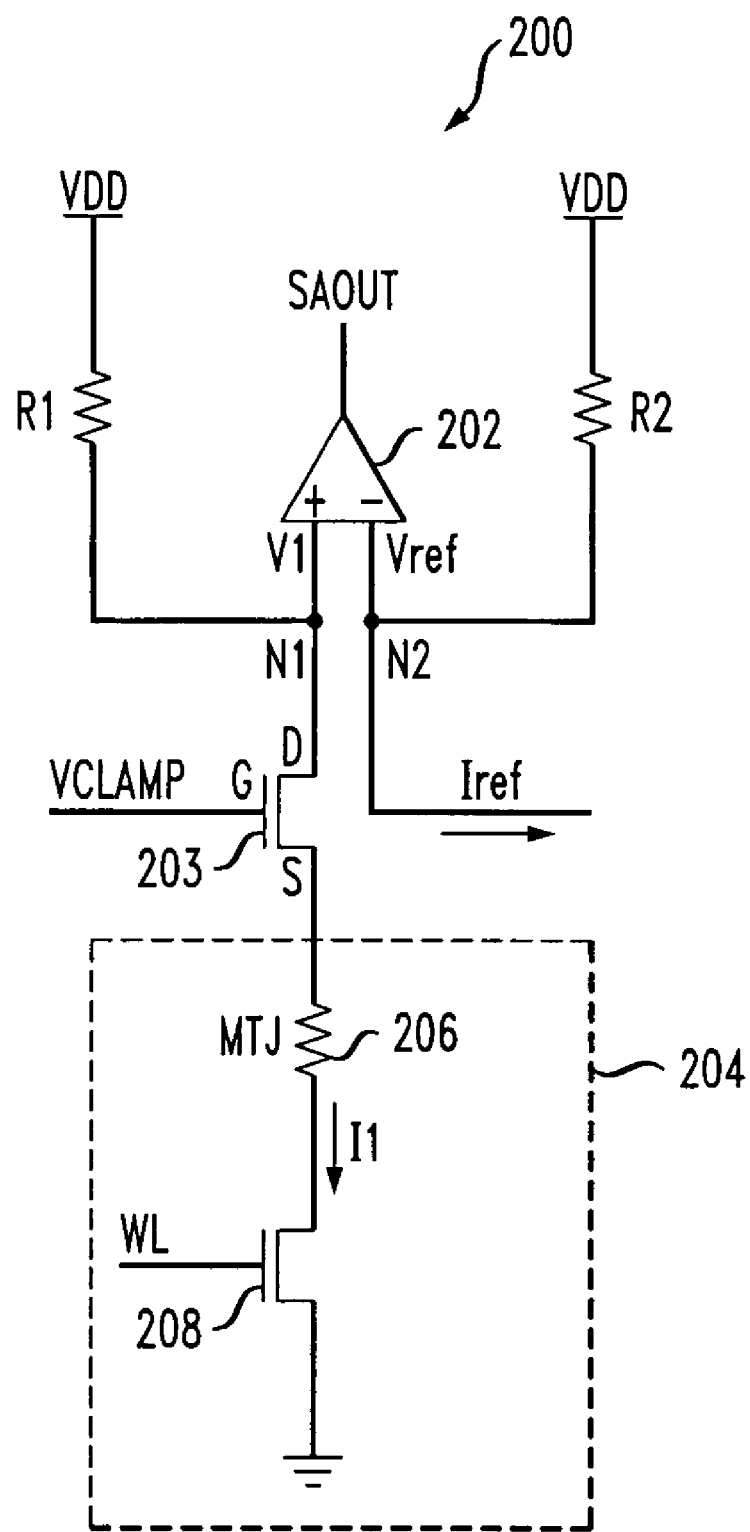
FIG. 2 is a schematic diagram illustrating an exemplary sense amplifier which may be employed in the memory circuit of FIG. 1, in accordance with an embodiment of the invention.

FIG. 2 is a schematic diagram depicting an exemplary sense amplifier 200 which may be employed in the memory circuit 100 shown in FIG. 1, in accordance with one aspect of the invention. The sense amplifier 200 includes a comparator 202 having a first input, which may be a non-inverting (+) input, connected to a drain of an NMOS clamp transistor 203. A source of NMOS device 203 is connected to a selected memory cell 204 which includes a MTJ storage element 206 (shown as a resistor) and a corresponding access transistor 208 connected thereto. The access transistor 208, which may be an NMOS device, includes a gate adapted to receive a control signal, WL, for selectively accessing the MTJ storage element 206. A second input, which may be an inverting (−) input, of the comparator 202 preferably receives a reference voltage, Vref, at node N2. The reference voltage Vref may be generated, for example, by pulling a reference current, Iref, through a known load resistor, R2, connected between a voltage supply (e.g., VDD) and the second input of the comparator 202 at node N2. A second load resistor, R1, is preferably connected between the voltage supply VDD and the first input of the comparator 202 at node N1. Load resistor R1 is used to generate a voltage, V1, at node N1 which is a function of a current, I1, flowing through the MTJ storage element 206 in the memory cell 204. This voltage V1 will be representative of a logic state of the memory cell 204.

A standard read operation can be performed by clamping a read voltage, VCLAMP (e.g., about 0.7 volt), across the selected memory cell 204. The clamped read voltage VCLAMP causes the current I1 to flow through the load resistor R1, thereby generating the voltage V1 at node N1. The comparator 202 in sense amplifier 200 compares the voltage V1 with the reference voltage Vref and generates an output signal, SAOUT, which is representative of the logic state of the memory cell 204.

It is to be appreciated that although the memory circuit and/or sense amplifier may be illustrated in the accompanying figures as comprising a plurality of separate functional blocks for ease of explanation, one or more of these blocks can be combined with one another, or with other circuit blocks external to the memory circuit and/or sense amplifier. For instance, certain elements in the control circuitry 112 may be integrated with the clamp voltage distribution circuitry 114.

With reference to FIGS. 1 and 2, during a read cycle the logic state of a selected memory cell can be determined by applying a voltage, Vclamp, to the cell and comparing the resulting current, $I_{DATA}$, flowing through the cell to a reference current, $I_{REF}$. The voltage Vclamp is set to a first value, which may be referred to herein as a read voltage, during the read cycle. The read voltage is preferably about 0.7 volt, although the invention is not limited to any particular voltage level. When $I_{DATA}$ is greater than $I_{REF}$, the sense amplifier will preferably generate an output signal, SA_Out indicative of a high logic state read from the selected memory cell. Similarly, when $I_{DATA}$ is less than $I_{REF}$, the sense amplifier will preferably generate an output signal (e.g., ground) indicative of a low logic state read from the selected memory cell. The output SA_Out of the sense amplifier is preferably latched, for example, by latch circuitry within the sense amplifier itself or by latch circuitry external to the sense amplifier.

The reference current $I_{REF}$ is preferably set to a midrange distribution between a low logic state and a high logic state, and above a current value corresponding to a lowest expected resistance of an acceptable (i.e., functioning) memory cell. Any measured current which is higher than this reference current will therefore be indicative of a shorted bit. The reference current $I_{REF}$ may be generated within the memory circuit itself, either internally or externally with respect to the sense amplifier, such as by a local reference generator circuit (e.g., bandgap reference, etc.). Alternatively, the reference current may be supplied externally with respect to the memory circuit 100, such as by an external test system (e.g., tester) coupled to the memory circuit. Preferably, the reference current is generated within the memory circuit 100 so that the reference current can more closely track variations in certain characteristics of the device, including process, voltage and/or temperature (PVT) conditions to which the memory circuit may be subjected.

During a read cycle, a selected memory cell corresponding to a particular row/column address is read. The row/column address may be supplied externally, such as by a test system, or may be internally generated, such as by test mode or alternative control circuitry included in the memory circuit 100. When the logic state read from the selected memory cell substantially matches a predicted value for that cell, the cell is determined to be functioning normally and the row/column address is incremented (or decremented) to a next selected memory cell in the memory array 102. The read operation is then repeated until either a defective bit is detected or until all memory cells in the memory array have been read.

In accordance with one aspect of the invention, when a defective bit is detected, such as when the measured memory cell current $I_{DATA}$ is greater than the reference current $I_{REF}$, the tester (or the memory circuit itself) preferably stores the address of the defective bit and then increments (or decrements) the address to the next selected memory cell in the memory array 102. Once all memory cells in the memory array have been read, the stored addresses of all defective bits are subsequently used to attempt a repair of the defective memory cells corresponding thereto. Alternatively, in accordance with another aspect of the invention, when a defective bit is encountered, the control circuitry 112 in the memory circuit 100 preferably switches to a repair mode of operation to immediately attempt a repair of the memory cell corresponding thereto. In this instance, there is no need to store the addresses of defective bits. Once the defective bit has been repaired, or once it has been determined that the bit cannot be repaired, the address is incremented (or decremented) to the next selected memory cell in the memory array 102. This process is repeated until all memory cells in the array have been read.

In either of the above scenarios (e.g., storing addresses corresponding to all defective bits for subsequent repair, or implementing an immediate repair each time a defective bit is detected), in the repair mode the voltage Vclamp applied to the selected memory cell in the memory array 102 is raised from the read voltage to a second value, which may be referred to herein as a stressing or burn-in voltage. Preferably, the stressing voltage is substantially greater than the read voltage. For an illustrative 180 nanometer integrated circuit process, the read voltage is about 0.7 volt, and the voltage across the actual MTJ storage element will be about one threshold voltage lower than this voltage (e.g., less than about 0.3 volt). The stressing voltage level in this instance may be, for example, about 1.4 volts, although the invention is not limited to any particular voltage levels for the read or stressing voltages.

The stressing voltage is applied to the defective memory cell preferably as a pulse of a set duration (i.e., pulse width). The present invention also contemplates that the stressing voltage applied during a given stressing cycle may comprise a series of pulses, rather than a single pulse. By way of example only, for a read cycle of about 40 nanoseconds (ns), the stressing voltage may be applied to the defective memory cell for about 25 ns, although the invention is not limited to any particular duration of the stressing voltage. In fact, the mechanism for repairing a defective bit may be attributable to a combination of pulse duration and rise time and/or fall time of the applied stressing voltage. Therefore, a stressing voltage pulse (or pulses) having a substantially fast rise time and/or fall time (e.g., less than about a few nanoseconds) is preferred.

It is to be appreciated that in order to repair a defective bit, more than one stress cycle (i.e., application of a stressing voltage) may be required. After each stress cycle, the voltage applied to the selected memory cell is preferably reduced back down to the standard read voltage and the cell is read again to determine if the short still exists. If the bit is still found to be defective, another stress cycle is preferably applied to the memory cell and the read process is repeated. The number of stress cycles applied to each defective memory cell may be tracked, for example by a counter or alternative counting circuitry, residing either in the memory circuit itself or outside of the memory circuit (e.g., in the tester). For instance, a counter (not directly shown) may be included in the control circuitry 112 in memory circuit 100. The counter can be compared to a set maximum value (e.g., 5) for limiting the number of stress cycles performed on a given defective bit in the memory circuit. Without a mechanism for limiting the number of stress cycles applied to a defective memory cell, a test program (e.g., implemented on the test system or running as a test mode in the memory circuit) may become stalled while attempting to repair a defective cell which cannot be repaired. Once the set maximum value for the number of stress cycles has been reached, the control circuitry within the memory circuit, or alternatively the test system, can be instructed to increment the address to the next selected memory cell and/or defective bit.

Repaired bits and/or bits that are determined to be functioning normally (e.g., within an acceptable range of operation) have a tendency to fail after being stressed by a stressing voltage. Since only defective bits initiate the repair mode of operation in the memory circuit 100, the present invention beneficially ensures that functioning bits (e.g., normal and/or or previously repaired bits) will be protected from receiving the stressing voltage. This is an important aspect of the present invention which can be advantageously utilized in lowering the yield threshold needed to obtain a commercially viable process.

Figure 3A:
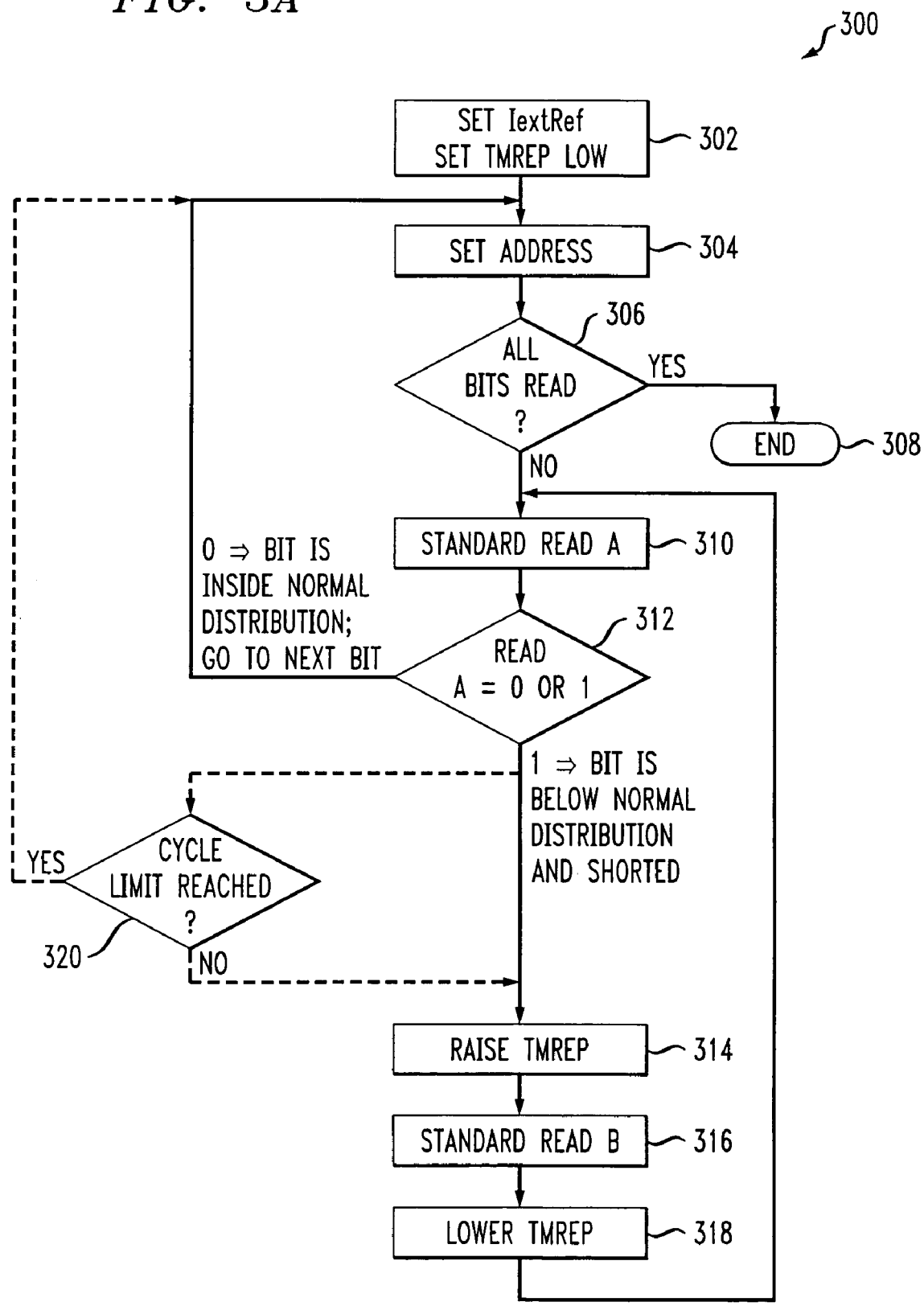
FIG. 3A is a logical flow diagram depicting an exemplary method for repairing shorted bits, in accordance with one aspect of the invention.

By way of example only, and without loss of generality, FIG. 3A is a logical flow diagram depicting an illustrative method 300 for repairing one or more shorted bits in a memory circuit, in accordance with one embodiment of the invention. The method preferably begins with an initialization step 302. During initialization, the reference current, IextRef, is preferably set substantially equal to the current of a functioning memory cell having the lowest resistance anticipated over variations in PVT conditions. In this manner, a selected memory cell having a measured current which is greater than the reference current will be indicative of a shorted bit. As apparent from the figure, the reference current may be supplied externally with respect to the memory circuit under test (e.g., by the test system), although the reference current may alternatively be generated internally, as previously stated. During the initialization step 302, control signal TMREP is preferably set to a level (e.g., logic low) which enables selection of the read voltage for application to a selected memory cell. Once initialization has been completed, the address, which preferably includes the row address and column address, is set to read the selected memory cell at step 304.

Before reading the selected memory cell corresponding to the address set at step 304, it is first desirable to determine whether or not all bits in the memory circuit have been read. This determination is made at step 306. It is to be understood, however, that the step of determining whether or not all bits in the memory circuit have been read may be performed at various other points throughout the method 300, as will be apparent to those skilled in the art. For example, step 306 may be performed prior to setting the address at step 304. When all bits have been read, the method 300 preferably ends at step 308. When all bits have not been read, process flow preferably continues to step 310 where a standard read operation of the selected memory cell is performed using the read voltage (Read A). By performing a read operation, the clamp voltage Vclamp, which in this case is the read voltage, is applied across the corresponding storage element in the selected memory cell.

The result of the read operation at step 310 (e.g., SA_Out signal from sense amplifier) is preferably used to control process flow to either continue to read a next selected bit in the memory circuit (e.g., when a "0" is read) or to initiate the repair mode, wherein one or more stress cycles are applied in an attempt to repair the defective bit (e.g., when a "1" is read). This determination is performed at step 312. By way of example only, when it is determined, at step 312, that the bit being read is functioning within a normal range of operation (i.e., not defective), process flow continues to step 304, where the address is set to the next selected memory cell. When a defective bit is detected, process flow is directed to step 314, where a repair of the defective bit is initiated.

Beginning at step 314, control signal TMREP is set to a logic high level, thereby enabling the control circuitry 112 in the memory circuit 100 (FIG. 1) to raise the clamp voltage Vclamp from the read voltage level to the stressing voltage level. After the clamp voltage has been raised, a standard read operation is performed on the defective bit at step 316 using the stressing voltage (Read B). As previously explained, by performing a read operation, the clamp voltage Vclamp, which in the repair mode is the stressing voltage, is applied to the corresponding storage element in the selected memory cell. The higher stressing voltage is applied to the memory cell for the duration of the standard read pulse. It is to be understood that while using a standard read timing may provide a less complex approach, the stressing voltage may also be applied by way of modified read timings (e.g., shorter or longer than a standard read cycle). The duration of the applied stressing voltage may even be varied (e.g., increased or decreased) depending on the number of stress cycles required to repair a given defective bit. After performing the read using the higher stressing voltage, control signal TMREP is set low again at step 318, thereby lowering the clamp voltage back down to the read voltage. Process flow is then directed to step 310, where a standard read is performed at the lower read voltage (Read A).

As previously stated, a counter is optionally used for tracking the number of stress cycles performed on each defective bit. At step 320, this counter can be checked and compared against a set maximum value so as to limit the number of stress cycles performed on a given defective bit. At step 320, when the set maximum value is reached, process flow is directed to step 304, where the address is set to the next selected bit. When the set maximum value has not been attained, the counter is preferably incremented and another stress cycle is performed on the defective bit beginning at step 314. Process flow then continues in the manner previously described.

Figure 3B:
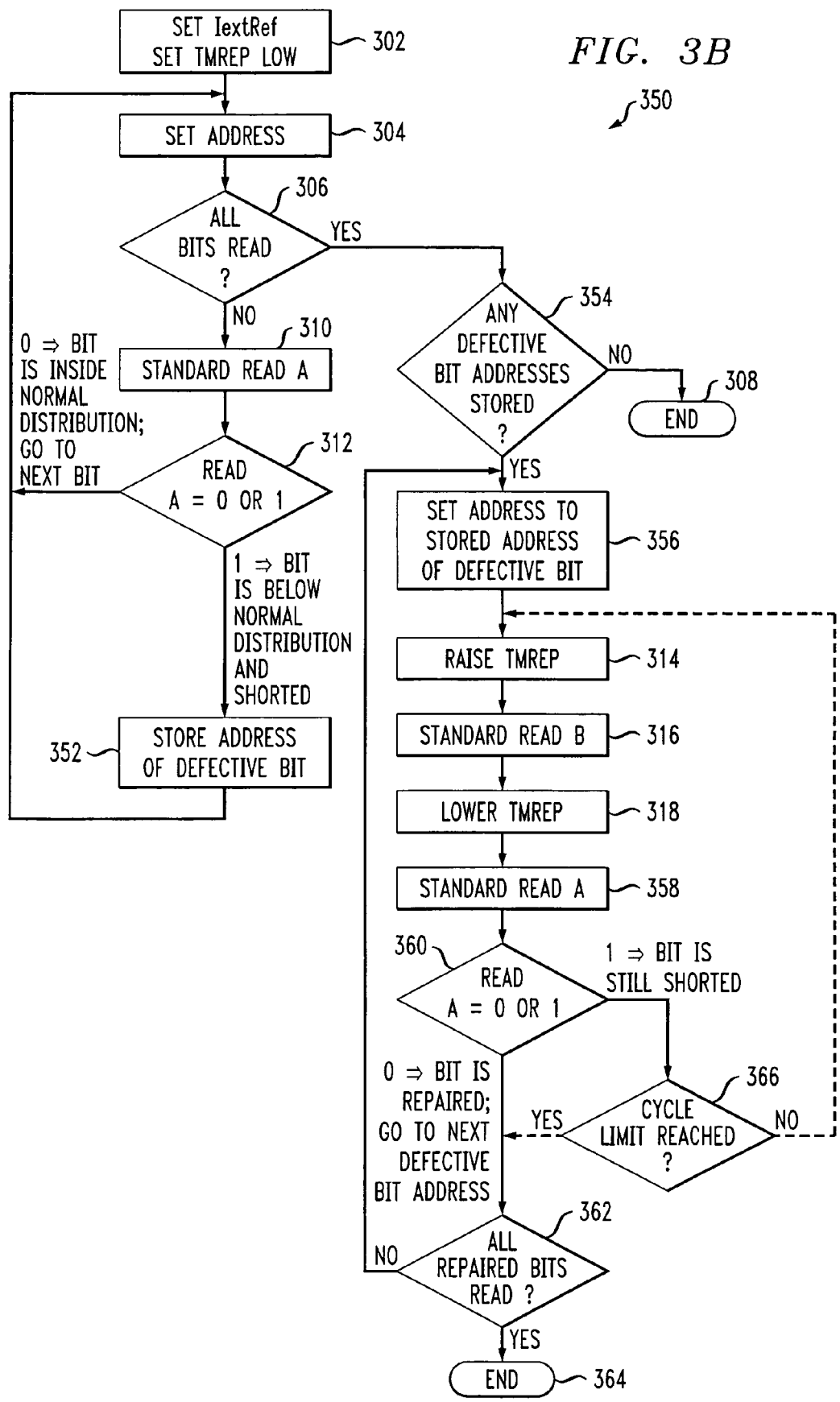
FIG. 3B is a logical flow diagram depicting an exemplary method for repairing shorted bits, in accordance with another aspect of the invention.

FIG. 3B is a logical flow diagram depicting an exemplary method 350 for repairing one or more shorted bits in a memory circuit, in accordance with another embodiment of the invention. Method 350 is essentially a modified version of method 300 shown in FIG. 3A. Rather than initiate an immediate bit repair process of each shorted bit upon detection, as in method 300 of FIG. 3A, method 350 preferably first stores the addresses of all defective bits before initiating the bit repair process to attempt a repair of any shorted bits.

Like method 300 (FIG. 3A), method 350 preferably begins with an initialization step 302 wherein the reference current IextRef is set substantially equal to the current of a functioning memory cell having the lowest resistance anticipated over variations in PVT conditions. Additionally, control signal TMREP is preferably set to a level (e.g., logic low) which enables selection of the read voltage for application to a selected memory cell. Next, the address (e.g., generated by the memory circuit itself or supplied externally) is preferably set to read a selected memory cell at step 304. The method 350 performs a check at step 306 to determine whether or not all bits have been read. If all bits have not been read, a standard read is performed at step 310 using the read voltage (Read A). Depending on the logic state read from the selected memory cell, if the bit is determined to functioning (e.g., logic "0") at step 312, process flow continues to step 304, where a new address is set for the next selected memory cell in the memory circuit. If the bit is found to be shorted (e.g., logic "1"), the address of the defective bit is stored at step 352, such as in memory included either in the memory circuit itself or outside the memory circuit. Process flow then continues to step 304, where a new address is set to read the next selected memory cell.

Once all bits in the memory circuit have been read, process flow continues at step 354, where the method 350 preferably checks to see whether any defective bit addresses have been stored. If not, method 350 ends at step 308. If one or more defective bit addresses have been stored, process flow continues at step 356, where the bit repair process is initiated. In step 356, the defective bit address is loaded from memory, thereby selecting a first shorted bit in the memory circuit. Control signal TMREP is then set to a level (e.g., logic high) at step 314 which enables selection of the stressing voltage for application to the defective memory cell. A standard read is then performed on the shorted bit at step 316 using the stressing voltage (Read B). Control signal TMREP is set to a level (e.g., logic low) at step 318 which enables selection of the read voltage for application to the selected memory cell. A standard read is then performed at step 358 using the read voltage (Read A).

The result of the read operation from step 358 is evaluated at step 360 in order to determine whether or not the shorted bit has been repaired. If the defective bit is determined to be functioning (e.g, logic "0" read), process flow continues at step 362, where the method 350 evaluates whether or not a repair process has been performed on all defective memory cells corresponding to the stored defective bit addresses. After all defective bits have been repaired, or after a repair attempt has been made on all defective bits, the method 350 ends at step 364. If the repair process has not been performed on all defective bits, process flow continues at step 356, where the next defective bit address is loaded. If, at step 360, it is determined that the defective bit is still shorted (e.g., logic "1" read), process flow continues at step 314, where another stress cycle is performed in an attempt to repair the defective bit.

As in the method 300 depicted in FIG. 3A, method 350 preferably utilizes a counter, or alternative counting circuitry, for tracking the number of stress cycles performed on each defective bit. This counter can be checked and compared against a set maximum value so as to limit the number of stress cycles performed on a given defective bit. For example, once a defective bit has been evaluated at step 360, if the bit is still found to be shorted, the stress cycle counter is optionally evaluated at step 366. When the set maximum value is reached, process flow continues at step 362, where an evaluation is made as to whether a repair has been at least attempted on all defective bits. When the set maximum value has not been attained, the counter is preferably incremented and another stress cycle is performed on the defective bit beginning at step 314. Process flow then continues in the manner described above.

Figure 4:
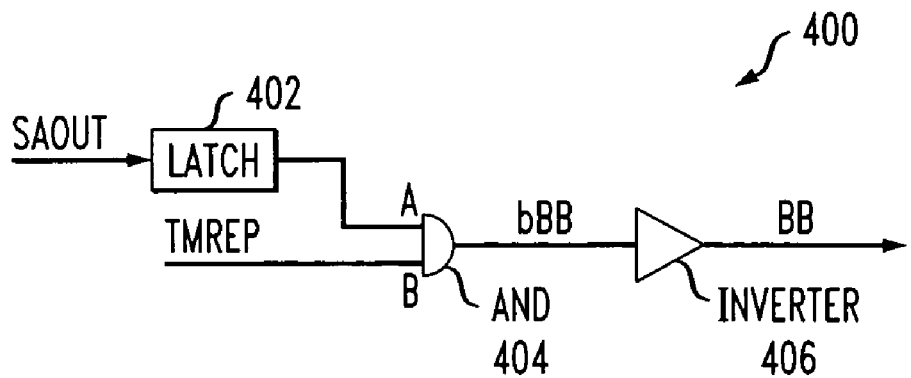
FIG. 4 is a schematic diagram illustrating an exemplary latch circuit for at least temporarily storing a state of the sense amplifier(s) in the memory circuit of FIG. 1, in accordance with an embodiment of the invention.

FIG. 4 is a schematic diagram illustrating an exemplary enable circuit 400 which may be used in the control circuitry 112 in the memory circuit 100 shown in FIG. 1, in accordance with an embodiment of the invention. Enable circuit 400 can be utilized to generate a repair mode selection signal, BB, for controlling the clamp voltage distribution circuitry 114 in the memory circuit 100 (see FIG. 1) to selectively switch the clamp voltage Vclamp between the read voltage and the stressing voltage, depending on the output signal SA_Out from the sense amplifier and/or in response to other control signals which may be supplied to the memory circuit.

As apparent from the figure, the output of the sense amplifier SA_Out is preferably stored in a latch circuit 402, or alternative storage circuitry. The latched output signal from the sense amplifier is supplied to a first input (A) of a logical AND gate 404. A second input (B) of the AND gate 404 is adapted to receive control signal TMREP. An output signal, bBB, generated by AND gate 404 is preferably inverted by an inverter 406, or alternative inversion circuitry, to generate the repair mode selection signal BB. It is to be understood that the present invention is not limited to the specific enable circuit arrangement shown.

When control signal TMREP is low, the repair mode selection signal BB will be inactive (e.g., logic "1"). When TMREP is high, the activation of the repair mode selection signal BB will depend on the logic state read from the selected memory cell, as represented by the output SA_Out of the sense amplifier. For example, when SA_Out is low, the repair mode selection signal BB will be inactive, thereby setting the clamp voltage Vclamp to the read voltage. When SA_Out is high, signal BB will be active, thereby setting the clamp voltage Vclamp to the stressing voltage.

Figure 5:
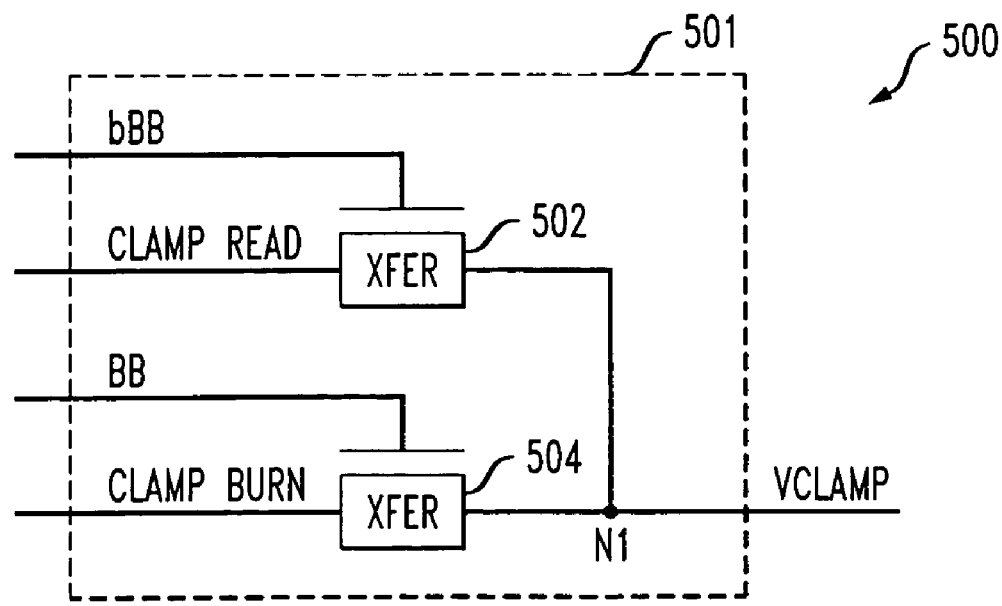
FIG. 5 is a schematic diagram illustrating an exemplary clamp voltage distribution circuit for use in the memory circuit of FIG. 1, in accordance with an embodiment of the invention.

FIG. 5 is a schematic diagram of an exemplary clamp voltage selection circuit 500 which may be employed in the clamp voltage distribution circuitry 114 in the memory circuit 100 shown in FIG. 1, in accordance with an embodiment of the invention. The clamp voltage selection circuit 500 preferably includes selection circuitry 501 which is operative to receive at least the read voltage (Clamp Read) and the stressing voltage (Clamp Burn) as inputs and to generate the clamp voltage signal Vclamp. Vclamp will take on the level of one of the input voltages, read voltage or stressing voltage, as a function of the repair mode selection signal BB.

Selection circuitry 501 preferably comprises at least a first transfer gate (xfer) 502 and a second transfer gate 504. A first terminal of the first transfer gate 502 is adapted to receive the read voltage and a first terminal of the second transfer gate 504 is adapted to receive the stressing voltage. Second terminals of the first and second transfer gates 502, 504 are connected to one another and form an output at node N1 for generating the clamp voltage Vclamp. A control input of the first transfer gate 502 is adapted to receive a control signal, bBB, which is logical complement of the repair mode selection signal BB. A control input of the second transfer gate 504 is adapted to receive repair mode selection signal BB. When repair mode selection signal BB is high, and therefore signal bBB is low, first transfer gate 502 will be turned on and second transfer gate 504 will be turned off, thereby setting the clamp voltage Vclamp to the read voltage. When repair mode selection signal BB is low and bBB is high, transfer gate 502 will be turned off and transfer gate 504 will be turned on, thereby setting Vclamp to the stressing voltage.

Although clamp voltage selection circuit 500 is depicted as generating a clamp voltage Vclamp which is set to one of two possible voltage levels, namely, the read voltage and the stressing voltage, the present invention is not limited to selection between only two voltages. For example, in accordance with another embodiment of the invention, clamp voltage selection circuit 500 may be operative to set the clamp voltage Vclamp to one of three of more voltage levels as a function of two or more control signals presented thereto. This may be beneficial, for example, when multiple stressing voltage levels are employed to repair shorted bits in the memory circuit.

At least a portion of the memory circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. Apparatus for repairing one or more shorted memory cells in a memory circuit, the apparatus comprising:
   control circuitry, the control circuitry being operative in one of at least a first mode and a second mode, wherein in the first mode the control circuitry is operative to apply a first signal to a selected memory cell in the memory circuit for reading a logic state of the selected memory cell and to determine whether or not the selected memory cell is shorted, wherein in the second mode the control circuitry is operative to apply a second signal to a selected memory cell which has been determined to be shorted for initiating a repair of the selected memory cell, the second signal being greater in magnitude than the first signal.

2. The apparatus of claim 1, wherein the control circuitry is operative in the first mode to read all memory cells in the memory circuit.

3. The apparatus of claim 1, wherein the control circuitry is operative in the second mode to initiate a repair of all shorted memory cells in the memory circuit.

4. The apparatus of claim 1, wherein the control circuitry is operative to store at least one address corresponding to at least one respective memory cell in the memory circuit which has been determined to be shorted.

5. The apparatus of claim 1, wherein the control circuitry, after initiating a repair of the selected memory cell in the second mode, is operative in the first mode to apply the first signal to the selected memory cell to determine whether or not the selected memory cell has been repaired.

6. The apparatus of claim 1, wherein the control circuitry is operative to initiate a repair of a selected memory cell determined to be shorted by performing one or more successive repair cycles on the selected memory cell, wherein in each repair cycle the control circuitry is operative in the second mode to apply the second signal to the selected memory cell and is operative in the first mode to apply the first signal to the selected memory cell for reading the state of the selected memory cell, the state read from the selected memory cell being used to make a determination as to whether or not the selected memory cell is shorted.

7. The apparatus of claim 6, where the control circuitry is operative to perform the one or more repair cycles until it is determined that the selected memory has been repaired.

8. The apparatus of claim 6, where the control circuitry is operative to perform the one or more repair cycles until a set number of repair cycles has been reached for a given selected memory cell.

9. The apparatus of claim 1, wherein the first signal comprises a read voltage and the second signal comprises a stressing voltage.

10. The apparatus of claim 1, further comprising a reference generator operative to generate the first and second signals.

11. The apparatus of claim 1, wherein the first signal is set to a value representative of a lowest expected resistance of a functioning memory cell in the memory circuit.

12. The apparatus of claim 1, further comprising a voltage clamp distribution circuit, the voltage clamp distribution circuit including a first input adapted to receive the first signal, and at least a second input adapted to receive the second signal, the voltage clamp distribution circuit being operative to selectively apply one of the first and second signals to the selected memory cell as a function of at least one control signal presented to the voltage clamp distribution circuit.

13. The apparatus of claim 1, further comprising memory connected to the control circuitry for storing one or more addresses corresponding to one or more respective memory cells that have been determined to be shorted.

14. The apparatus of claim 1, wherein the control circuitry includes an enable circuit comprising:
   a latch circuit including an input adapted for receiving a signal representative of the logic state of the selected memory cell and an output for generating a latched signal representative of the logic state of the selected memory cell; and
   a logical AND gate including a first input connected to the output of the latch circuit, a second input adapted for receiving a first control signal, and an output for generating a second control signal for selecting a mode of operation of the control circuitry;
   wherein when the first control signal is a first logic level, the control circuitry is operative in the first mode, and when the first control signal is a second logic level, the control circuitry is selectively operative in one of at least the first mode and the second mode as a function of the logic state of the selected memory cell.

15. A method for repairing one or more shorted memory cells in a memory circuit, the method comprising the steps of:
   setting a signal to be applied to a selected memory cell in the memory circuit to a first value;
   setting a current address to a value corresponding to a current selected memory cell in the memory circuit;
   reading a logic state of the current selected memory cell with the signal at the first value and determining whether or not the current selected memory cell is shorted;
   when the current selected memory cell is determined to be shorted, initiating a repair of the shorted memory cell, and repeating the steps of reading the logic state of the current selected memory cell and determining whether or not the selected memory cell is shorted, wherein the step of initiating a repair of the shorted memory cell comprises the steps of:
  (i) setting the signal to be applied to the selected memory cell to a second value, the second value being greater than the first value;
  (ii) applying the signal at the second value to the current selected memory cell for initiating a repair of the memory cell;
  (iii) setting the signal to be applied to the selected memory cell to the first value;
  (iv) reading a logic state of the current selected memory cell with the signal at the first value to determine whether or not the current selected memory cell is shorted; and
  repeating steps (i) through (iv) until the current selected memory cell is determined to be not shorted; and
when the current selected memory cell is determined to be not shorted, setting the current address to a value corresponding to a new current selected memory cell which has not been previously read, and repeating the steps of reading the logic state of the current selected memory cell and determining whether or not the selected memory cell is shorted.

16. A method for repairing one or more shorted memory cells in a memory circuit, the method comprising the steps of:
  setting a signal to be applied to a selected memory cell in the memory circuit to a first value;
  setting a current address to a value corresponding to a current selected memory cell in the memory circuit;
  reading a logic state of the current selected memory cell with the signal at the first value and determining whether or not the current selected memory cell is shorted;
  when the current selected memory cell is determined to be shorted, initiating a repair of the shorted memory cell, and repeating the steps of reading the logic state of the current selected memory cell and determining whether or not the selected memory cell is shorted;
  when the current selected memory cell is determined to be not shorted, setting the current address to a value corresponding to a new current selected memory cell which has not been previously read, and repeating the steps of reading the logic state of the current selected memory cell and determining whether or not the selected memory cell is shorted;
  initializing a value of a repair cycle counter;
  after performing the step of initiating a repair of the shorted memory cell, incrementing or decrementing the value of the repair cycle counter;
  when the value of the repair cycle counter has reached a value corresponding to a limit of the number of repair cycles performed on a given selected memory cell, setting the current address to a value corresponding to a new current selected memory cell which has not been previously read, and repeating the steps of reading the logic state of the current selected memory cell and determining whether or not the selected memory cell is shorted; and
  when the value of the repair cycle counter has not reached the value corresponding to the limit of the number of repair cycles performed on a given selected memory cell, repeating the steps of initiating a repair of the shorted memory cell, reading the logic state of the current selected memory cell and determining whether or not the selected memory cell is shorted.

17. A method for repairing one or more shorted memory cells in a memory circuit, the method comprising the steps of:
  setting a signal to be applied to a selected memory cell in the memory circuit to a first value;
  setting a current address to a value corresponding to a current selected memory cell in the memory circuit;
  reading a logic state of the current selected memory cell with the signal at the first value and determining whether or not the current selected memory cell is shorted;
  when the current selected memory cell is determined to be shorted, initiating a repair of the shorted memory cell, and repeating the steps of reading the logic state of the current selected memory cell and determining whether or not the selected memory cell is shorted, wherein the step of initiating a repair of the shorted memory cell comprises the steps of reading a logic state of the current selected memory cell with the signal at a second value, the second value being greater than the first value, and determining whether or not the current selected memory cell is shorted; and
  when the current selected memory cell is determined to be not shorted, setting the current address to a value corresponding to a new current selected memory cell which has not been previously read, and repeating the steps of reading the logic state of the current selected memory cell and determining whether or not the selected memory cell is shorted.

18. A method for repairing one or more shorted memory cells in a memory circuit, the method comprising the steps of:
  setting a signal to be applied to a selected memory cell in the memory circuit to a first value;
  setting a current address to a value corresponding to a current selected memory cell in the memory circuit;
  reading a logic state of the current selected memory cell with the signal at the first value and determining whether or not the current selected memory cell is shorted;
  when the current selected memory cell is determined to be shorted, storing the current address corresponding to the shorted memory cell;
  setting the current address to a value corresponding to a new current selected memory cell which has not been previously read, and repeating the steps of reading the logic state of the current selected memory cell and determining whether or not the selected memory cell is shorted;
  when at least one address corresponding to a shorted memory cell has been stored, initiating a repair of the shorted memory cell, wherein the step of initiating a repair of the shorted memory cell comprises:
    (i) setting the current address to a stored address corresponding to a shorted memory cell in the memory circuit;
    (ii) setting the signal to be applied to the selected memory cell to a second value, the second value being greater than the first value;
    (iii) applying the signal at the second value to the current selected memory cell for initiating a repair of the memory cell;
    (iv) setting the signal to be applied to the selected memory cell to the first value;

(v) reading a logic state of the current selected memory cell with the signal at the first value to determine whether or not the current selected memory cell is shorted; and repeating steps (ii) through (v) until the current selected memory cell is determined to be not shorted.

19. An integrated circuit including at least one apparatus for repairing one or more shorted memory cells in a memory circuit, the at least one apparatus comprising:

control circuitry, the control circuitry being operative in one of at least a first mode and a second mode, wherein in the first mode the control circuitry is operative to apply a first signal to a selected memory cell in the memory circuit for reading a logic state of the selected memory cell and to determine whether or not the selected memory cell is shorted, wherein in the second mode the control circuitry is operative to apply a second signal to a selected memory cell which has been determined to be shorted for initiating a repair of the selected memory cell, the second signal being greater in magnitude than the first signal.

* * * * *